United States Patent [19]

Mukai

[11] Patent Number: 4,543,133
[45] Date of Patent: Sep. 24, 1985

[54] PROCESS FOR PRODUCING SINGLE CRYSTALLINE SEMICONDUCTOR ISLAND ON INSULATOR

[75] Inventor: Ryoichi Mukai, Kawaguchi, Japan
[73] Assignee: Fujitsu Limited, Kawagawa, Japan
[21] Appl. No.: 604,719
[22] Filed: Apr. 27, 1984
[30] Foreign Application Priority Data Apr. 30, 1983 [JP] Japan ................................ 58-076566

[51] Int. Cl.[4] .................... H01L 21/263; C30B 13/06; B05D 3/06
[52] U.S. Cl. .................................. 148/1.5; 29/576 B; 29/576 T; 148/175; 148/187; 357/91; 427/53.1
[58] Field of Search .......................... 148/1.5, 187, 175; 29/576 B, 576 T; 357/91; 427/53.1

[56] References Cited

U.S. PATENT DOCUMENTS

| 4,330,363 | 5/1982 | Biegesen et al. | 156/620 |
| 4,372,990 | 2/1983 | Lam | 427/53.1 |
| 4,409,724 | 10/1983 | Tasch, Jr. et al. | 29/571 |
| 4,414,242 | 11/1983 | Nishimura et al. | 427/53.1 |
| 4,431,459 | 2/1984 | Teng | 148/1.5 |
| 4,448,632 | 5/1984 | Akasaka | 29/576 B |
| 4,461,670 | 7/1984 | Celler et al. | 427/53.1 |

FOREIGN PATENT DOCUMENTS

| EPA0047140 | 8/1981 | European Pat. Off. | |
| 0068094 | 1/1983 | European Pat. Off. | 29/576 T |
| 0048926 | 4/1980 | Japan | 29/576 B |
| 0126914 | 10/1981 | Japan | |
| 0157019 | 12/1981 | Japan | 29/576 T |

OTHER PUBLICATIONS

Biegelsen et al., Applied Physics Letters, vol. 38, No. 3, Feb. 1, 1981, New York, p. 150.
Hawkins et al., Applied Physics Letter 40(4), Feb. 15, 1982.
Colinge et al., Applied Physics Letter 41(4), Aug. 15, 1982, p. 346.

Primary Examiner—Upendra Roy
Attorney, Agent, or Firm—Armstrong, Nikaido, Marmelstein & Kubovcik

[57] ABSTRACT

A process for producing a single crystalline semiconductor island on an insulator, comprising the steps of providing a semiconductor island comprising a non-monocrystalline semiconductor on an insulator; forming an energy-absorbing cap layer which coats at least the upper and side surfaces of the semiconductor island; irradiating the energy-absorbing cap layer with an energy beam; and melting and transforming the coated nonmonocrystalline semiconductor into a single crystalline semiconductor with the heat generated in the energy-absorbing cap layer.

6 Claims, 5 Drawing Figures

PROCESS FOR PRODUCING SINGLE CRYSTALLINE SEMICONDUCTOR ISLAND ON INSULATOR

BACKGROUND OF THE INVENTION

The present invention relates to a process for producing a single crystalline semiconductor island on an insulator.

It is well known to use a so-called silicon-on-insulator (SOI) structure to form an integrated circuit device with a three-dimensional structure and thus improve the integration of a semiconductor integrated circuit device.

In an SOI structure, it is essential to form single crystalline semiconductor islands on an insulator so as to form a semiconductor device. This is usually achieved by forming a polycrystalline or amorphus semiconductor layer on a silicon oxide insulator layer or substrate, dividing the semiconductor layer into islands, and then melting and recrystallizing the semiconductor islands into single crystalline semiconductor islands using, e.g., an argon ion laser beam.

It is difficult, however, to achieve uniform cooling and recrystallization of semiconductor islands. This is because only the silicon islands absorb the energy of the argon ion laser beam. Therefore, thermal diffusion to the unheated silicon oxide insulator reduces the temperature along the island edges.

Considerable research has been performed aimed at producing single crystalline semiconductor islands on an insulator. One approach has been to provide the silicon substrate under the central portion of the islands with a conductive path having a thermal resistance lower than that of the surrounding areas so as to accelerate cooling of the central portion of the islands. This process, however, cannot be applied to produce a three-dimensional structure.

J. P. Colinge et al. report a process in "Use of Selective Annealing for Growing Very Large Grain Silicon on Insulator Films", Applied Physics Letter 41 (4), Aug. 15, 1982, page 346, in which silicon wafers are thermally oxidized and capped with a polycrystalline silicon layer which is, in turn, capped with a patterned silicon nitride layer. When the wafers are scanned with an argon ion laser, silicon nitride works as an antireflective layer. The polycrystalline silicon under the silicon nitride therefore exhibits a higher temperature than that of the surrounding area. Colinge's concept can be applied to selective annealing of a polycrystalline silicon layer for forming a three-dimensional structure integrated circuit device, however, it has the disadvantage of involving the additional troublesome step of patterning the silicon nitride layer by means of photolithography.

W. G. Hawkins et al. report a process in "Growth of Single-Crystal Silicon Islands on Bulk-Fused Silica by $CO_2$ Laser Annealing," Applied Physics Letter 40(4), Feb. 15, 1982, page 319, in which $CO_2$ laser radiation is used. Generally, silicon oxide will absorb $CO_2$ laser radiation, while silicon islands will substantially not. Hawkins et al. showed that the silicon oxide surrounding the islands would absorb about 87 percent of the incident energy, while the silicon dioxide under the islands would absorb only 70 percent. Consequently, the island edges are much hotter than the central portions. In the process of Hawkins et al., however, it is necessary that the silicon oxide be thick enough to absorb the $CO_2$ laser energy so as to melt the silicon islands. This process is therefore not suitable for producing a three-dimensional structure.

Incidentally, Hawkins et al. remark that the reproducible growth of oriented single crystalline silicon islands through use of an argon ion laser has not yet been demonstrated, although they recognize much progress has been made toward understanding mechanisms which control crystal growth under argon ion laser irradiation.

SUMMARY OF THE INVENTION

It is a primary object of the present invention to provide a process for producing single crystalline semiconductor islands on an insulator.

It is another object of the present invention to provide a process for producing single crystalline semiconductor islands on an insulator suitable for use in producing a three-dimensional structure large-scale integrated circuit (LSI) device.

It is still another object of the present invention to provide a process for producing single crystalline semiconductor islands without applying a selectively patterned layer antireflective to an incident energy radiation.

It is yet another object of the present invention to provide a process for producing single crystalline semiconductor islands of different species on an insulator in a single step.

According to the present invention, there is provided a process for producing single crystalline semiconductor islands on an insulator, particularly in a semiconductor substrate suitable for use in producing a three-dimensional structure semiconductor device, comprising the steps of providing a semiconductor island comprising a nonmonocrystalline semiconductor on an insulator; forming an energy-absorbing cap layer which coats at least the upper and side surfaces of the semiconductor island; irradiating the energy-absorbing cap layer with an energy beam; and melting and transforming the coated nonmonocrystalline semiconductor into a single crystalline semiconductor with the heat generated in the energy-absorbing cap layer.

BRIEF DESCRIPTION OF THE DRAWINGS

These and other objects and advantages of the present invention will become apparent from the ensuing description of the preferred embodiments made with reference to the accompanying figures, wherein.

DESCRIPTION OF THE PREFERRED EMBODIMENT

Before describing the preferred embodiments, a more detailed explanation of a modification of the above prior art will be given for reference.

Figure 1:
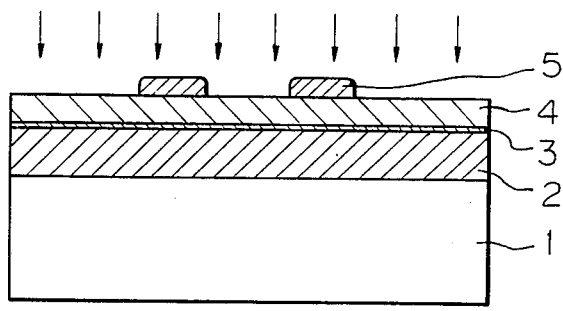
FIG. 1 is a schematic view of a process for annealing a nonmonocrystalline island on an insulator according to the prior art.
Figure 2:
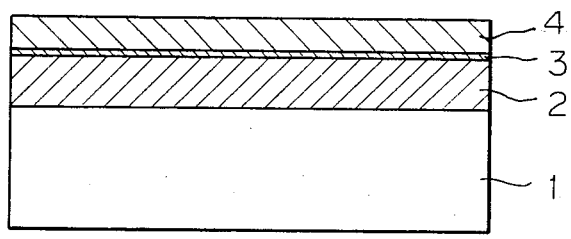
FIGS. 2(a) to (d) are schematic views of a process for annealing a nonmonocrystalline island on an insulator according to the present invention.
Figure 2:
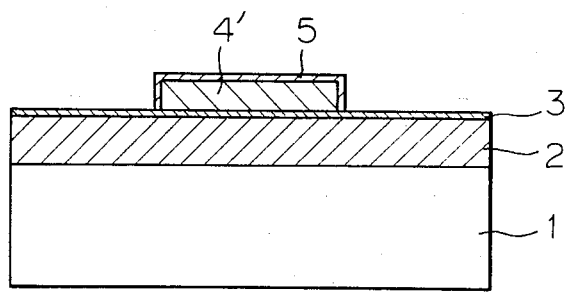
Figure 2C:
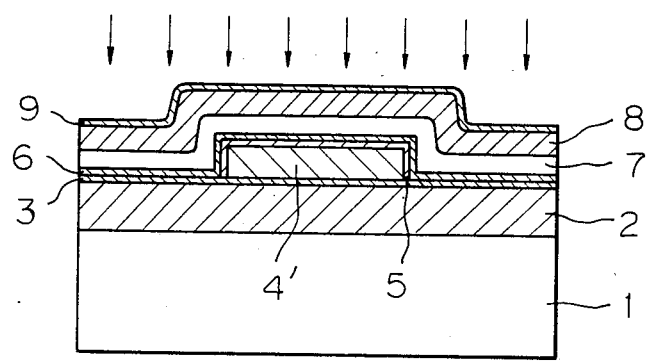
Figure 2D:
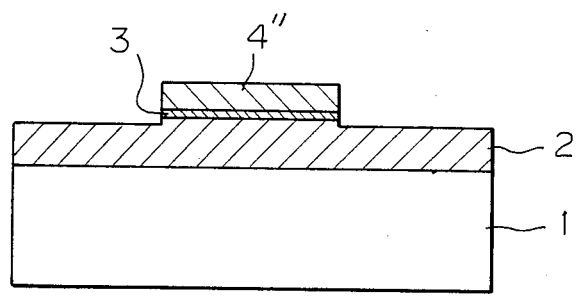

The prior art is schematically illustrated in FIG. 1. The surface of a silicon substrate 1 is thermally oxidized to form a silicon oxide insulating layer 2. A silicon nitride layer 3 is deposited thereon so as to improve the wetness of molten silicon to the silicon oxide insulating layer 2. A polycrystalline silicon layer 4 is deposited. A patterned antireflective silicon nitride layer 5 is formed on the polycrystalline silicon layer 4 so as to reduce the reflection of the incident argon ion laser beam.

The amount of the laser beam absorbed by the polycrystalline silicon layer 4 in the area located under the antireflective silicon nitride layer 5 is larger than that absorbed in the area not covered with the silicon nitride layer 5, and the temperature of the former is higher than the latter. Consequently, a single crystalline silicon layer is formed in the area located between the sections of the silicon nitride layers 5.

A process for producing an SOI structure according to the present invention will now be explained referring to FIGS. 2(a) to (d).

A silicon substrate 1 is thermally oxidized to form an silicon oxide insulating layer 2 of about 1 $\mu$m thickness. Then, silicon nitride is deposited to form a wetting layer 3 of about 50 nm thickness by means of chemical vapor deposition (CVD). A polycrystalline silicon layer 4 of about 400 nm thickness is also formed by CVD (FIG. 2(a)).

A polycrystalline silicon island 4' is patterned from the polycrystalline silicon layer 4 by photolithography and dry etching. The surface of the polycrystalline silicon island 4' is thermally oxidized so as to form a silicon oxide layer 5 of about 50 nm thickness (FIG. 2(b)) as separating layer.

A silicon nitride layer 6 of about 30 to 50 nm thickness is formed on the silicon oxide layer 5 as a wetting layer, similar to the wetting layer 3. Then, a polycrystalline silicon layer 7 of about 350 nm thickness is formed on the silicon nitride layer 6 as an energy-absorbing cap layer. The polycrystalline silicon layer 7 is thermally oxidized to a depth of about 300 nm so as to form a silicon oxide cap layer 8, and silicon nitride is deposited to form a cap layer 9 of about 50 nm thickness. The silicon oxide and silicon nitride cap layers 8 and 9 act as antireflective layers against an argon ion laser beam and enable shape stabilization of the polycrystalline silicon layer 7.

Then, a continuous wave argon ion laser beam of about 30 $\mu$m beam diameter having about 5 W output is irradiated on the silicon substrate 1 at a scanning speed of about 5 cm/s. The polycrystalline silicon layer 7 absorbs the energy of the laser irradiation. This energy is transformed to heat in the polycrystalline silicon layer 7. Thus, the polycrystalline silicon in the polycrystalline silicon layer 7 and the polycrystalline silicon island 4' melts. The heat capacity is larger in the area of the polycrystalline silicon island 4' than in the surrounding area of the silicon substrate 1. Therefore, the temperature is lower in the island area than in the surrounding area. Consequently, the recrystallization proceeds from the central portion of the island to the edges, so as to form a uniform single crystalline silicon island 4'' (FIG. 2(c)).

After cooling the silicon substrate 1, the silicon nitride layers 6 and 9, the silicon oxide layers 5 and 8, and the polycrystalline silicon layer 7 are removed by etching with hot phosphorus acid, fluoric acid, and a mixture of fluoric, nitric, phosphoric, and perchloric acids, respectively. The etching is carried out to remove each layer as a whole, i.e., no selective photolithography is necessary (FIG. 2(d)).

While the above description was made in reference to a preferred embodiment, it is to be understood that the present invention is not limited thereto. For example, the silicon nitride layers 3, 6, and 9 and silicon oxide layers 5 and 8 are not essential to carry out the process according to the present invention. However, it is advantageous to coat the energy-absorbing cap layer with an antireflective layer, to form a separating layer between the semiconductor island and energy-absorbing cap layer, and to form a wetting layer under the semiconductor island and under the energy-absorbing cap layer.

The invention is also not limited to silicon as the semiconductor material. It is possible to cover a plurality of semiconductor islands of different chemical species, e.g., silicon and gallium-arsenic, with a single energy-absorbing cap layer and to have a single step of recrystallization.

Also, instead of an argon ion laser beam, a neodymium: yttrium-aluminum-garnet laser beam may be used to irradiate the polycrystalline silicon cap layer formed on at least the upper and side surfaces of the polycrystalline silicon island as such a neodymium:yttrium-aluminum-garnet laser beam is selectively absorbed by silicon. Alternatively, a $CO_2$ laser beam may be used as a $CO_2$ laser beam is selectively absorbed by silicon oxide. Further, it is possible to apply an electron beam having an energy corresponding to that of the cap layer capable of absorbing that of the electron beam.

I claim:

1. A process of producing a single crystalline semiconductor island on an insulator, comprising the steps of:
    forming a semiconductor island of a nonmonocrystalline semiconductor, having upper and side surfaces, on an insulator;
    forming an energy-absorbing cap layer which coats at least said upper and side surfaces of said semiconductor island, said energy-absorbing cap layer being capable of absorbing radiant energy and generating heat enough to melt said semiconductor island; and
    irradiating said energy-absorbing cap layer with an energy beam of radiant energy sufficient to melt and transform said coated nonmonocrystalline semiconductor into a single crystalline semiconductor by the heat generated in said energy-absorbing cap layer.

2. A process according to claim 1, further comprising the step of forming an anti-reflective layer over said energy-absorbing cap layer.

3. A process according to claim 1, further comprising the step of forming a separating layer between said semiconductor island and said energy-absorbing cap layer.

4. A process according to claim 1, further comprising the step of forming a wetting layer under said semiconductor island and also under said energy-absorbing cap layer.

5. A process according to claim 1, wherein said nonmonocrystalline semiconductor is polycrystalline silicon, said energy-absorbing cap layer is polycrystalline silicon, and said energy beam is an argon ion laser beam.

6. A process for producing single crystalline semiconductor islands on an insulator, comprising the steps of:
    (a) forming an insulator layer on a substrate;
    (b) forming a first wetting layer on said insulator layer;
    (c) forming a semiconductor island of a nonmonocrystalline semiconductor on said wetting layer;
    (d) coating said semiconductor island with a separating layer;

(e) forming a second wetting layer on said separating layer;
(f) forming an energy-absorbing layer on said second wetting layer;
(g) forming a shape-stabilizing layer on said energy-absorbing layer;
(h) forming an antireflecting layer on said shape-stabilizing layer;
(i) irradiating said substrate and layers formed thereon with a laser beam, thereby generating heat in said energy-absorbing layer sufficient to melt and transform said nonmonocrystalline semiconductor of said semiconductor island into a single crystalline semiconductor by said generated heat; and
(j) removing all layers formed on said semiconductor island.

* * * * *